US005936646A

United States Patent [19]

Kenny et al.

[11] Patent Number: 5,936,646

[45] Date of Patent: *Aug. 10, 1999

[54] IMAGE PROCESSING EQUIPMENT WITH THERMALLY EFFICIENT HEAT DISSIPATING ELEMENT

[75] Inventors: Gary R. Kenny, Rochester; Dean Leonard Smith, Pittsford; Roger Stanley Kerr, Brockport, all of N.Y.

[73] Assignee: Eastman Kodak Company, Rochester, N.Y.

[ * ] Notice: This patent is subject to a terminal disclaimer.

[21] Appl. No.: 08/672,893

[22] Filed: Jun. 28, 1996

[51] Int. Cl.[6] .......................... B41J 29/377; H01L 23/26; H05K 7/20; F28F 7/00

[52] U.S. Cl. .......................... 347/18; 347/223; 174/16.3; 361/697; 165/80.3

[58] Field of Search .................................... 165/168, 185, 165/80.3; 257/712, 718, 722; 174/11 R, 15.1, 16.3; 29/890.046, 890.045; 361/274.2, 274.3, 514, 696, 697, 702, 694, 695; 372/36; 438/122; 439/487; 347/18, 207; 417/423

[56] References Cited

U.S. PATENT DOCUMENTS

| | | | |
|---|---|---|---|
| 3,970,411 | 7/1976 | Wallman | 416/178 |
| 4,164,690 | 8/1979 | Muller et al. | 318/254 |
| 4,165,950 | 8/1979 | Masai et al. | 416/178 |
| 4,554,491 | 11/1985 | Plunkett | 318/254 |
| 4,666,373 | 5/1987 | Sugiura | 416/185 |
| 4,879,891 | 11/1989 | Hinshaw | 72/254 |
| 4,884,331 | 12/1989 | Hinshaw | 29/558 |
| 5,146,144 | 9/1992 | Lee | 318/138 |
| 5,211,493 | 5/1993 | Stephenson et al. | 347/223 |
| 5,486,849 | 1/1996 | Miura et al. | 347/18 |
| 5,512,924 | 4/1996 | Takada et al. | 347/18 |
| 5,519,574 | 5/1996 | Kodama et al. | 361/697 |
| 5,629,834 | 5/1997 | Kodama et al. | 361/695 |
| 5,701,045 | 12/1997 | Yokozawa et al. | 310/62 |
| 5,760,512 | 6/1998 | Ohi et al. | 310/91 |
| 5,832,986 | 11/1998 | Kenny et al. | 165/80.3 |

FOREIGN PATENT DOCUMENTS

| | | |
|---|---|---|
| 0 411 462 | 2/1991 | European Pat. Off. . |
| 0814 269 A2 | 12/1997 | European Pat. Off. . |
| 63-112163 | 5/1988 | Japan . |
| 01018645 | 1/1989 | Japan . |

*Primary Examiner*—N. Le
*Assistant Examiner*—L. Anderson
*Attorney, Agent, or Firm*—Clyde E. Bailey, Sr.

[57] ABSTRACT

Image processing equipment(100) has a thermally activated write head element (200) that builds up heat during operations and an improved heat exchanger assemblage (300) having a high surface area heat sink (312) that absorbs and then dissipates the heat. Heat exchanger (300), structurally connected to the write head element (200), includes an air moving means (304) having a backward curved impeller (306) driven by a compact planar de motor for producing higher impeller speeds with superior thermal transfer performance.

5 Claims, 7 Drawing Sheets

SECTION 3-3

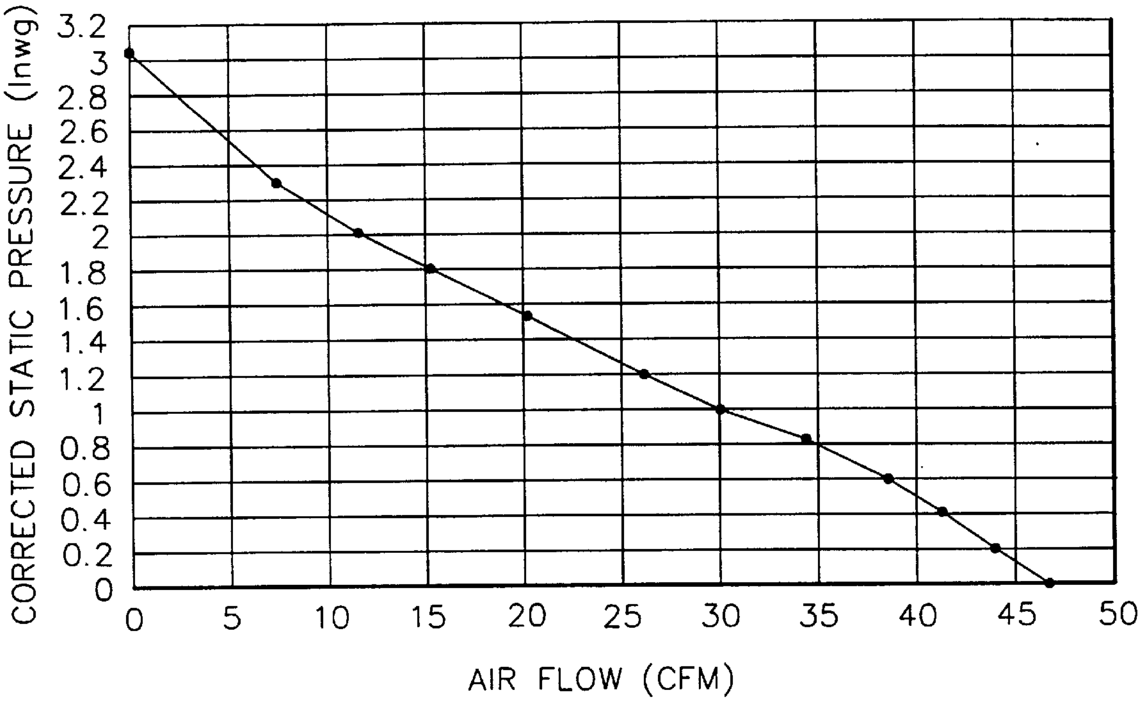
FIG. 10
FIG. 11
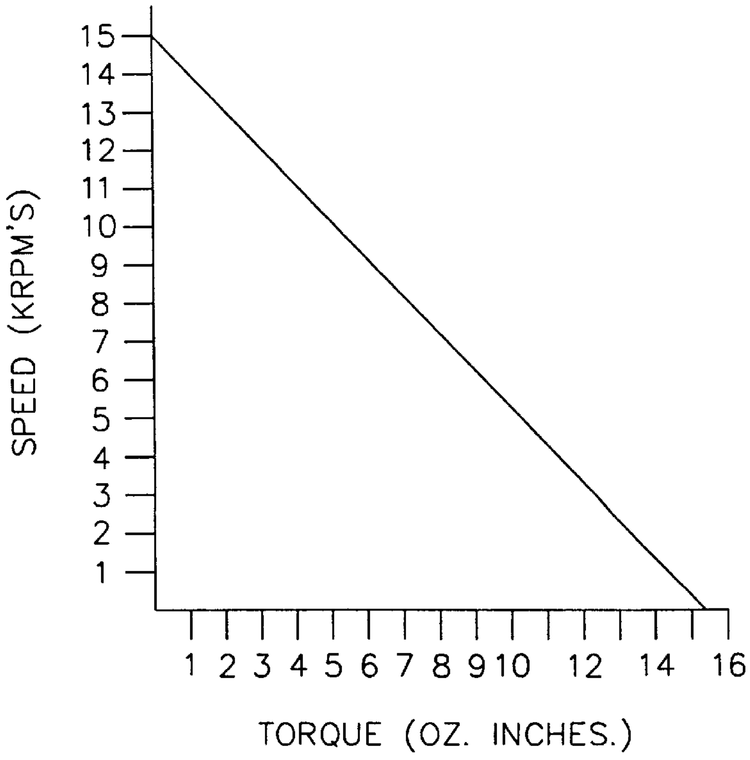

IMAGE PROCESSING EQUIPMENT WITH THERMALLY EFFICIENT HEAT DISSIPATING ELEMENT

CROSS REFERENCE TO RELATED APPLICATIONS

This application is related to the following applications: Ser. No. 08/674,221 for "An Improved Heat Exchanger" filed Jun. 28, 1996 by Gary R. Kenny, Dean L. Smith, and Roger S. Kerr; and Ser. No. 08/671,994 (abandoned in favor of continuing application Ser. No. 08/967,187, filed Oct. 29, 1997) for "Air Moving Device" filed Jun. 28, 1996 by Gary R. Kenny, Dean L. Smith, and Roger S. Kerr.

FIELD OF THE INVENTION

The invention relates to image processing equipment, and more particularly, the invention concerns image processing equipment having an improved heat exchanger for absorbing and dissipating heat buildup on the write head element thereby providing equipment that is more reliable and has a longer lasting thermal performance.

BACKGROUND OF THE INVENTION

Most electro-mechanical equipment, such as, computers, image processing equipment, and the like, employ some sort of heat exchanger to transfer fluid (heat) from one or more component parts to an alternative fluid stream. Since heat build-up generally diminishes the long-term performance and reliability of component parts of such equipment, heat exchanges are generally used to facilitate the heat transfer process.

In image processing equipment, for instance, a thermal write head element is heated, either by lasers or some other source, during operations (see, for instance, commonly owned U.S. Pat. No. 5,268,708 hereby incorporated herein by reference). During a work cycle, the write head element will absorb an enormous amount of heat. An overheated write head element may ultimately result in premature diminished print quality which would require equipment maintenance, typically write head element changeover or cleaning. Natural convection heat exchangers are most widely used to transfer heat away from the write head element. A shortcoming of naturally cooled heat sinks is that they typically require enormous space or volume within the equipment environment. Typically, natural convected cooled heat sinks require up to an order of magnitude increase in fin area to achieve comparable performance with that of a forced convected cooled heat sink.

Forced convective heat exchangers which employ oversized fans to increase the air flow at the heat sink have also been used to facilitate heat transfer from the write head element of image processing equipment. Existing forced convective heat exchangers, however, involve the use of relatively low flow air moving means (or fans) which are limited to overcoming only minimal static pressure in the heat sink. Moreover, the aforementioned forced convective heat exchangers are generally limited in the amount of fin surface area that can be provided for any given heat sink volume, due to the limited static pressure capability of the fin.

Conventional tubeaxial fans directly mounted to a heat sink may well be a option for cooling the write head element of image processing equipment. However, it is well known that tubeaxial fans are limited in their ability to overcome any appreciable resistance to airflow. By increasing the fin surface area increases the airflow resistance that the tubeaxial fan must overcome. At some point, increasing the surface area will decrease heat sink performance, as the tubeaxial fan becomes the limiting factor in the amount of air flow resistance it can overcome. Thus, for a given heat sink volume, there is a limit to the thermal resistance that a direct mounted existing tubeaxial fan can provide Moreover, remote mounted blowers may also be used in conjunction with the heat sink. However, it is our experience that remote mounted blowers have the inherent disadvantage of not offering a compact solution because of size and power that they require to function independent from the rest of the system. Additionally, remote mounted blowers may cause undesired disturbances in the translation of the write head element due to the ducting; thus, causing image defects. Where compact systems are required, these remote blowers are not a viable option.

Therefore, there persists a need for image processing equipment with an improved heat exchanger to facilitate heat transfer away from the write head element that has a compact, high velocity air moving means which can overcome high static pressure in very large surface area heat sinks.

SUMMARY OF THE INVENTION

It is, therefore, an object of the invention to provide image processing equipment with an efficient means for absorbing and dissipating heat buildup from the write head element thereby enabling superior thermal performance.

It is another object of the invention is to provide image processing equipment that has greater reliability and requires less maintenance than existing equipment.

It is a feature of the invention that the write head element of the image processing equipment has mounted thereon an improved heat exchanger for absorbing and dissipating heat buildup on the write head element. The improved heat exchanger includes a heat sink having very narrow fluid passageways, and therefore high resistance to fluid flow, which cooperates with a compact, high air velocity air moving means capable of overcoming the static pressure in the heat sink.

To overcome one or more problem in the prior art, there is provided in one aspect of the invention, image processing equipment, comprising a write head element for forming images on a media by actuated movements thereon. Write head element has mounted thereon means for absorbing and then dissipating heat. The aforementioned means comprises a heat sink having a closed base and a plurality of substantially parallel closely spaced fins supported by the base. The closely spaced fins form a plurality of narrow fluid passageways. Formed on opposite sides of the heat sink is a fluid inlet face and a fluid outlet face. In this embodiment, the plurality of fins have a heat transfer coefficient defined by the equation $$h=Nuk/De$$

where h is the convective heat-transfer coefficient, Nu is the Nusselt Number, a dimensionless number, and k is the thermal conductivity of the fluid; and De is the equivalent or hydraulic diameter of the formed fluid passageway, wherein De=4Ac/P, and where Ac is the flow cross sectional area of a fluid passageway, and P is the wetted perimeter. Moreover, an air moving means is structurally associated with the heat sink. The air moving means comprises at least a partial enclosure configured to provide a directional flow path for fluid entering and exiting the enclosure. An impeller is arranged for rotational movement in the at least partial enclosure. The impeller has a plurality of backward curved blades exposed to an opening in the enclosure for convectively moving fluid into the directional flow path in the enclosure and then through the plurality of fluid passageways of the heat sink. The impeller is capable of producing a fluid velocity and static pressure to force the fluid outside the at least partial enclosure through the closely spaced fins of the heat sink. Furthermore, a compact drive means operably connected to the impeller is provided for producing the rotational movement of the impeller.

It is, therefore, an advantageous effect of the invention that the image processing equipment having a write head element thermally associated with an efficient, high thermal conductive, compact heat exchanger element is more reliable and thermally efficient.

BRIEF DESCRIPTION OF THE DRAWINGS

The foregoing as well as other objects, features and advantages of this invention will become more apparent from the appended Figures, wherein like reference numerals denote like elements, and wherein:

FIG. 7–10 show the thermal resistance (corrected static pressure) of the heat exchanger.

FIG. 11 shows the speed torque curve for the drive motor of the invention.

DESCRIPTION OF PREFERRED EMBODIMENTS

Figure 1:
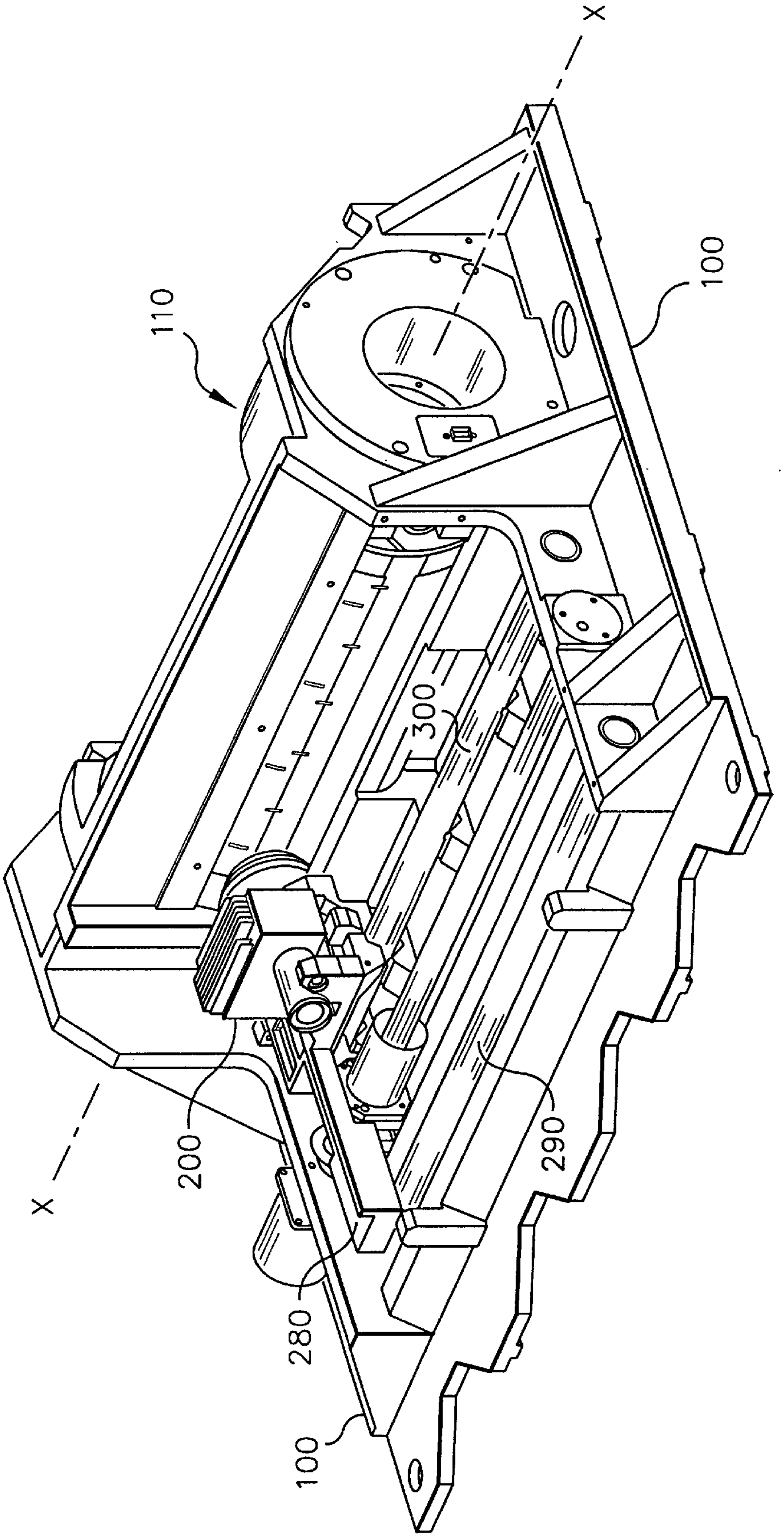
FIG. 1 is a perspective view of the image processing equipment.

Turning now to the drawings, and in particular to FIG. 1, the image processing equipment 100 according to the principles of the invention is illustrated. Equipment 100, broadly defined, comprises a write head element 200 for forming images on a media 110 and means 185 for thermally energizing the write head element 200. As shown in FIG. 1, means 280 is further provided for actuating the write head element 200 for movement about the media 110.

Figure 2:
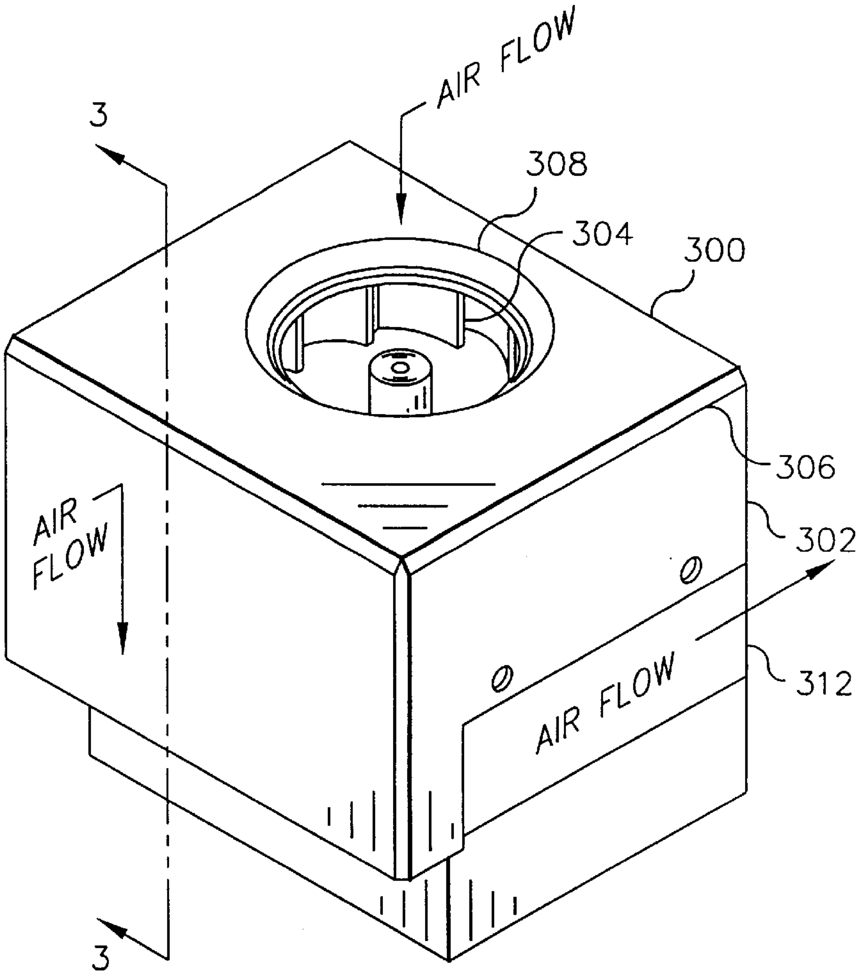
FIG. 2 is a perspective view, partially torn away, of the means for absorbing and dissipating heat buildup from the write head element of the invention.
Figure 3:
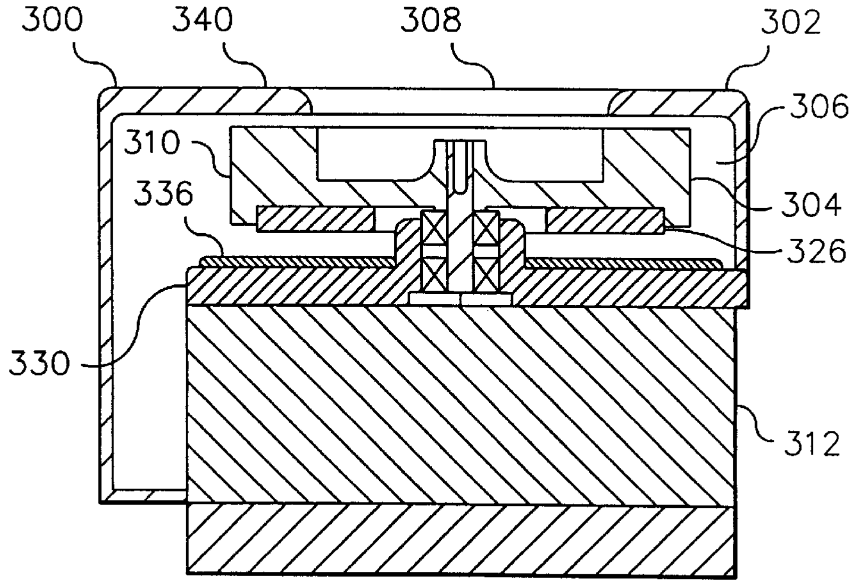
FIG. 3 is a section view along the 3—3 line of FIG. 2.
Figure 4:
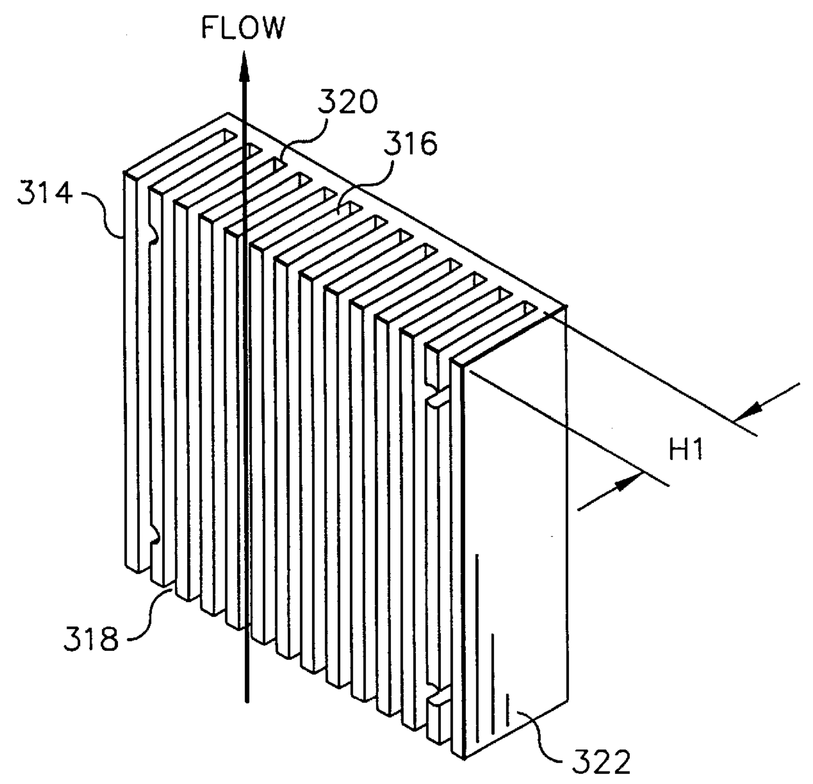
FIG. 4 is a schematic of a heat sink illustrating spaced fins and air flow passageways.
Figure 5:
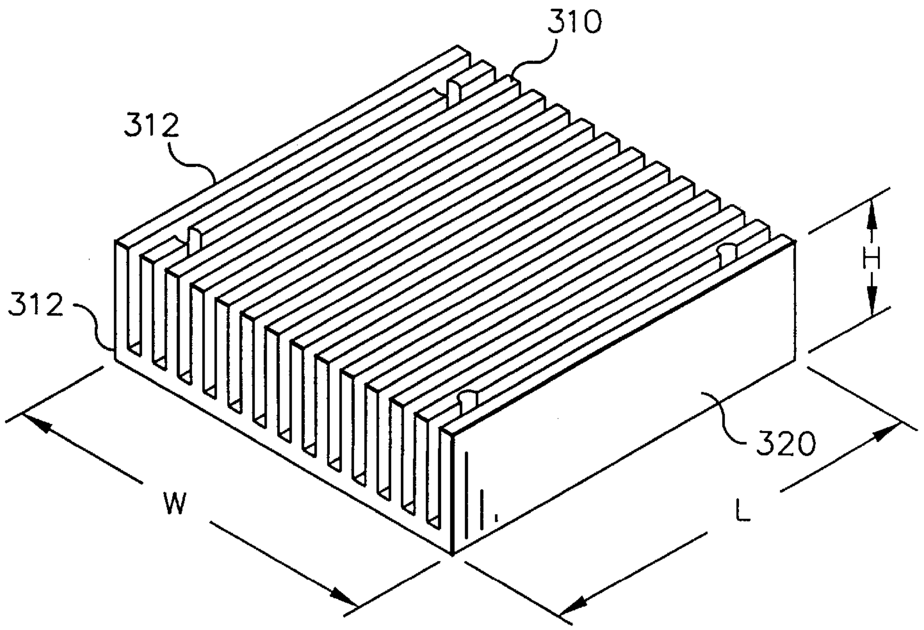
FIG. 5 is an orthographic view of a heat sink illustrating closely spaced fin arrangement.

In FIGS. 2–4, important to the invention, means, preferably a heat exchanger assemblage, 300, mounted for cooperatively associating with the write head element 200 of equipment 100, is provided for absorbing and then dissipating heat buildup from the write head element 200. Heat exchanger assemblage 300, broadly defined, includes at least a partial enclosure or housing, 302, and a compact fluid or air moving means, preferably a fan, 304, having impeller 306 (described below), exposed in an opening 308 (described further below) of housing 302. Impeller 306, as discussed below, comprises a plurality of backward curved blades 310 which forcefully directs air through the enclosure 302. Mounted onto air moving means 304 and arranged in enclosure 302 is a heat sink 312 for absorbing and then dissipating fluid (heat), as described fully below. Air moving means 304, described herein, is structurally mounted to heat sink 312 with preferably low thermal resistant screws and washers (not shown). Those skilled in the art will appreciate that air moving means 304 need not be connected to heat sink 312 nor limited to a single heat sink 312. It is, therefore, within the contemplation of the invention that a single air moving means can provide forced convection of fluid (air) moving through a plurality of heat sinks 312. Other important detailed features of the heat sink 312, air moving means 304 and enclosure or housing 302 are defined in greater details herein below.

Heat Sink (312)

According to FIGS. 3–4, heat sink 312 includes a plurality of substantially parallel closely spaced fins 314 supported by a base (not shown). In the preferred embodiment, the plurality of fins 314 has an average space width ($S_f$), as seen in FIG. 4, between about 0.008 inches 0.02032 cm) to about 0.060 inches (0.1524 cm). The lower limits of the average space width ($S_f$) is generally determined by present manufacturing capabilities and/or mechanical stability and/or uniformity of the fin. The closely spaced fins 314 form a plurality of narrow fluid passageways 316. In FIG. 3, an enlarged view of heat sink 312 is depicted having a plurality of fluid passageways 316, a fluid inlet face 318 and a fluid outlet face 320 opposite the fluid inlet face 318. FIG. 4 illustrates a typical heat sink 312 contemplated by the invention having a plurality of closely spaced fins 314. The closely spaced arrangement of the fins 314 of heat sink 312 results in very narrow fluid passageways or ducts 316. Consequently, there is increased resistance to air or fluid flow in the ducts 316 between the inlet face 318 and the outlet face 320).

An important property of heat sink 312 is the heat transfer coefficient (h) of the plurality of fins 314. It well known that the convective heat transfer coefficient (h) varies widely, over several orders of magnitude, and depends principally on the fluid velocity, the characteristics of the fluid, and, very importantly, on whether the fluid is experiencing a change of phase. (See for instance Walker, *Industrial Heat Exchangers, A Basic Guide*, pages 28–31, 2nd Ed, 1990.) Thus, according to conventional theory, the heat transfer coefficient is defined by the equation $$h=Nuk/De \qquad \text{Eq. (1)}$$

where h is the convective heat-transfer coefficient, Nu is the Nusselt Number, a dimensionless number, and k is the thermal conductivity of the fluid; and De is the equivalent diameter of the formed fluid passageway 316. In this configuration, $$De=4Ac/P, \qquad \text{Eq. (2)}$$

where Ac is the flow cross sectional area of a fluid passageway, and P is the wetted perimeter or the surface area 322 of the plurality of fins 314 exposed to the fluid.

In the present invention, the plurality of fins 314 has a heat transfer coefficient (h) up to about 99 Btu/hr-ft$^2$ deg F. It is well known that for laminar forced convection heat transfer in ducts 316 with fully developed temperature and velocity profile, the Nusselt Number is constant. Moreover, for a cross-sectional duct 316 with a large aspect ratio and a constant wall temperature, the Nusselt Number converges to 7.54. The hydraulic diameter for a channel 0.008 inches wide by 0.5 inches tall is 0.0012 feet. Using the thermal conductivity of air as 0.0152 Btu/hr-ft$^2$ deg F, the heat transfer coefficient (h) of the preferred fins 314 of the invention, according to equations (1) and (2), is calculated to be 99 Btu/hr-ft$^2$ deg F. It is important to appreciate that this high a value of heat transfer coefficient (h) was not obtainable in a compact heat exchanger. due to the inability of the tubeaxial fan to overcome high static pressures.

As illustrated in FIGS. 3–4, the plurality of fins 314 are preferably generally rectangularly shaped and planar. Skilled artisans will appreciate, however, that it is within the contemplation of the invention that fins 314 may take other configurations, such as folded or trapezoidal (not shown).

Air Moving Means 304

According to FIG. 2–3, heat exchanger 300 for cooling write head clement 200 of image processing equipment 100 includes air moving means 304 structurally mounted on the heat sink 312, described above. Shown clearly in the exploded view of FIG. 6, air moving means 304 arranged in enclosure or housing 302, referenced above, comprises impeller 306. Enclosure 302 is configured to provide a directional path for fluid entering and exiting the enclosure 302, as described below. Impeller 306 is arranged for rotational movement in the enclosure 302. Further, impeller 306 has a plurality of backward curved blades 324 exposed to opening 308 in enclosure 302 for convectively moving fluid into the enclosure 302. Thereafter, the forced convectively moving fluid travels through the inlet face 318 and then through the plurality of fluid passageways 316 of the heat sink 312 before exiting the outlet face 320) of heat sink 312. (As shown in FIG. 3) It is important to the invention that impeller 306 is capable of producing a fluid velocity and static pressure to force fluid outside the opening 308 and through the enclosure 302 through the closely spaced fins 314 of the heat sink 312.

Figure 6:
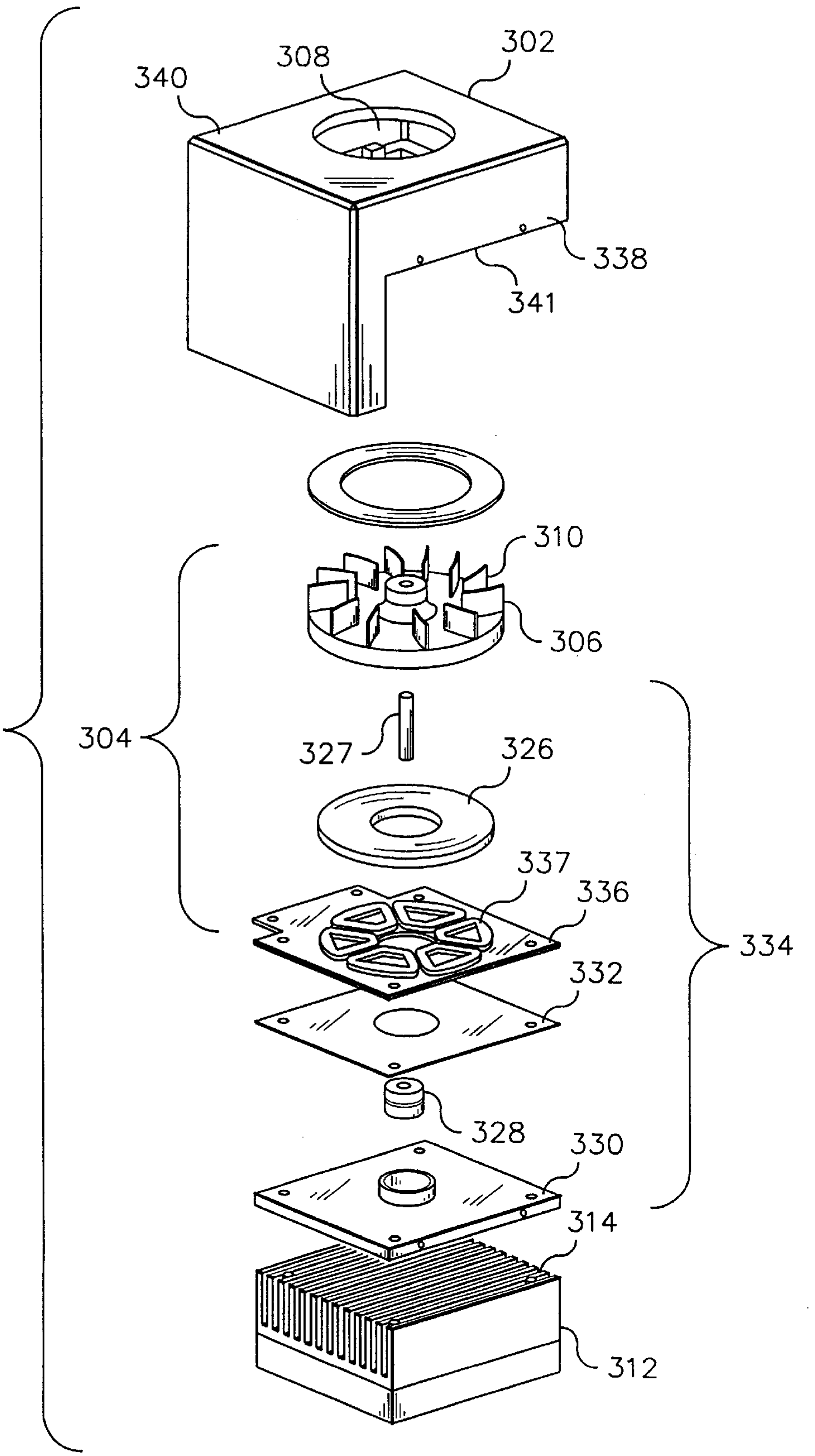
FIG. 6 is an exploded view of an air moving means of the invention.
Figure 7:
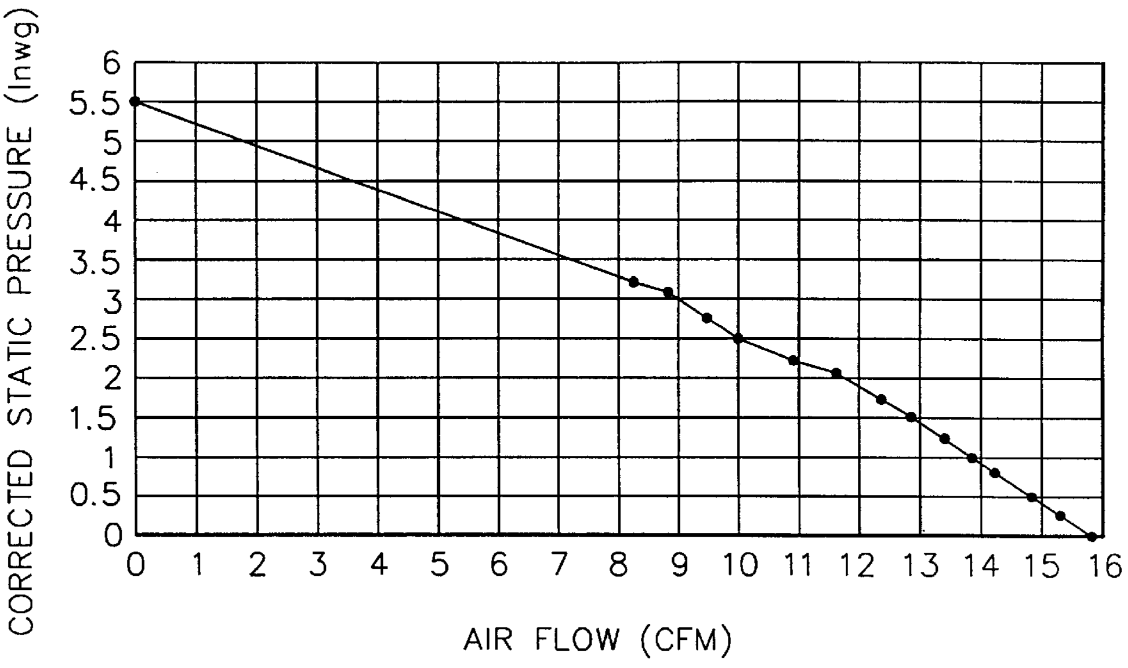
Figure 8:
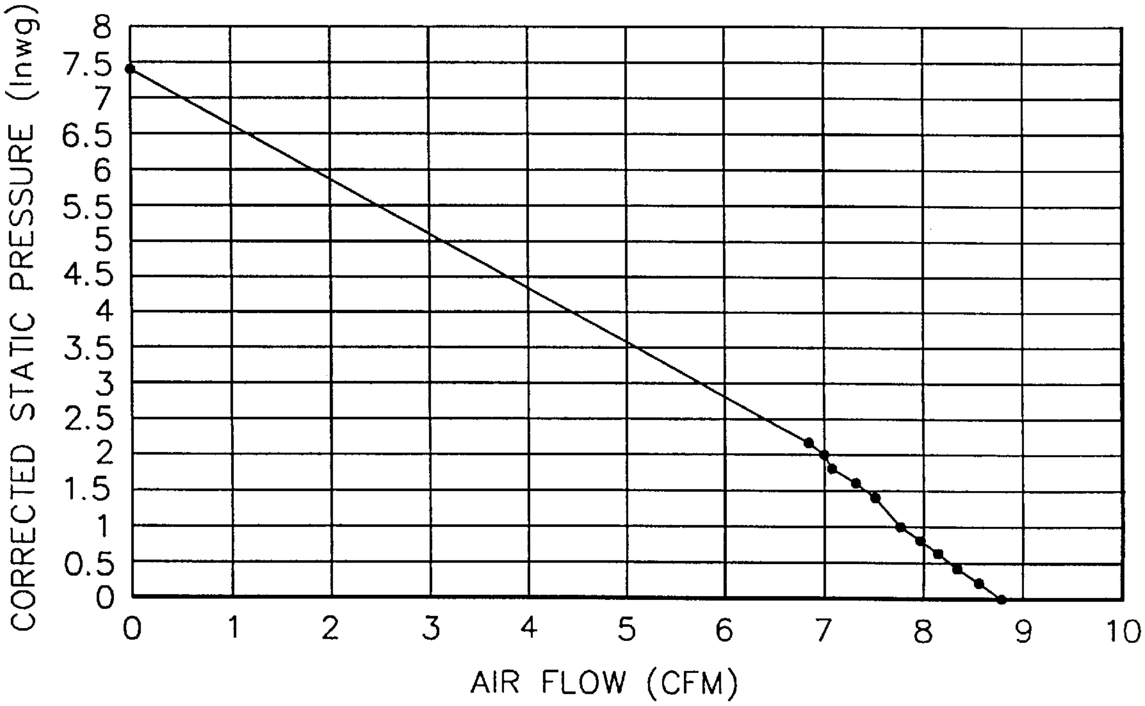
Figure 9:
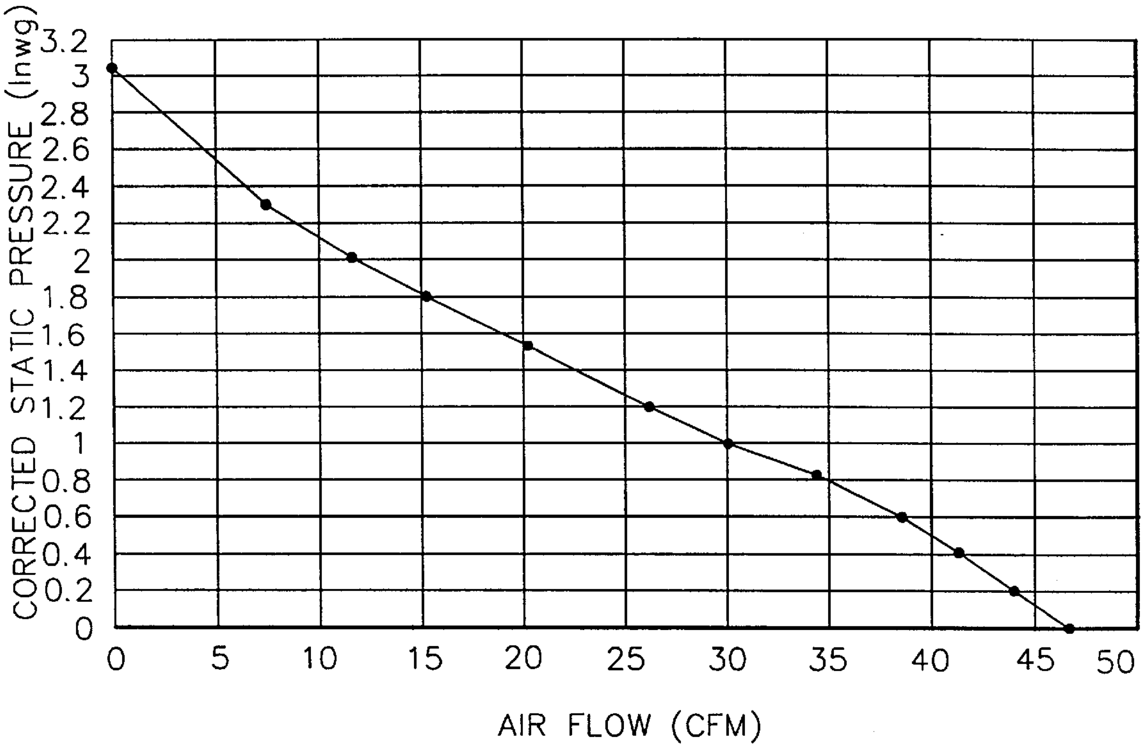

Referring again to the exploded view of FIG. 6, air moving means 304, arranged in enclosure 302, has impeller 306 disposed in the opening 308 of enclosure 302 for drawing air from the ambient air stream into enclosure 302. Further, a permanent magnet 326 is mounted to impeller 306 and a drive shaft 327. Magnet 326 cooperates with the drive means, discussed below, for controlling the rotation of impeller 306. Moreover, base assembly 147 of air moving means 304 includes ball bearings 328 to hold the shaft 327, a base plate 330 to accept the bearings 328, and a flux return plate 332 to minimize eddy current losses in the drive means 334, described below.

Drive Means 334

In FIGS. 2 & 6, drive means, preferably a compact dc motor, 334, operably connected to the impeller 306 is provided for producing the rotational movement of the impeller 306 in enclosure 302. DC motor 334 comprises a circuit board 336 for actuating the motor 334. Circuit board 336 includes a plurality of metallic coils 337 arranged in magnetic proximity to magnet 326 mounted to the impeller 306. The metallic coils 337 are configured to receive a current and thereby produce rotational movement of the impeller 306 in response to the current. Utilizing planar motor technology coupled with backward curved impeller design, illustrated in FIG. 6, we are now able produce the dc motor/fan combination of the invention with superior air flow characteristics. The planar dc motor technology makes use of a small compact motor, the preferred drive means 334, with the capacity to deliver relatively high torque to size ratios. Operably associated with the backward curved impeller 306, the de motor 334 enables the impeller 306 to achieve much higher fluid flow rates and overcome abnormally high static pressures.

It is well known that the plurality of fins 314 of the heat sink 312 present a fundamental problem in the removal of heat because it is fundamentally more desirable to employ as many fins 314 as possible and to make them as tall as possible to increase the surface area to aid in the removal of the heat. There becomes a practical limit to the height of the fin, as the taller the fin, the lower the fin efficiency. Anything higher than this practical limit has negligible impact on increasing the heat transfer. Consequently, when large fins with small spacing $S_f$ are used, the restriction to air flow is greatly increased. As indicated, conventional air movers do not have the static pressure capacity to achieve a high velocity through the heat sink, thus limiting their thermal performance. Using the heat exchanger assemblage 300 of the invention, it is now possible to employ therewith a backward curved impeller 306, as described herein, driven by a direct mounted, small dc motor 334, (see, for instance, commonly owned U.S. Pat. No. 5,146,144, hereby incorporated herein by reference), with sufficient speed/torque characteristics to overcome the restriction in the fluid passageways 316 formed by the plurality of closely spaced fins 314. Moreover, the heat exchanger assemblage 300, as described, is adapted to drive fluid (air) at a high velocity through the heat sink 312, thus achieving superior thermal performance. The direct mounted planar motor blower can therefore match the performance that a removable mounted blower can provide, while maintaining the advantage of a compact and self contained Solution that previously was unobtainable.

More particularly, drive means or dc motor 334 is configured to produce an impeller 306 speed of about 4000 RPM to about 15000 RPM, as shown in the graph of FIG. 11. According to FIG. 11, the full range of speeds that impeller 306 can achieve employing the preferred dc motor 334 is depicted.

Furthermore, the preferred drive means or dc motor, 334, is configured to produce a static pressure up to about 8 inches of water. FIGS. 7–10 show the air movers performance curve as a function of resistance to airflow (static pressure). The results generally indicate that this compact air mover 304 employing planar motor technology is capable of achieving a 20× increase in static pressure, compared to a tubeaxial fan heat exchanger described in the prior art.

According to FIGS. 7–10, air mover performance curves are depicted for a backward curve impeller 304 (or wheel) where the outside dimension of the impeller 304 (wheel) is held constant. The inside diameter (or inlet area) of the impeller 304 (wheel) is then varied, which effects the slope of the air movers performance curve. Thus, by varying the impeller dimensions, an infinite amount of different air mover performance curves are obtainable. This applies to both the inlet diameter as well as the outside diameter.

Since it is important to be able to arrange the heat exchanger element in the rather limited environment of the image processing equipment of the invention, the preferred air moving means 304 of the invention having the air flow velocity and ability to overcome high static pressure, as discussed above, has a height less than about 1.125 inches (cm) and a width of less than about 6 inches Enclosure 302

Referring particularly to FIG. 6, enclosure 302, in a preferred embodiment, comprises an interior compartment 341 formed by adjoining sidewalls 338 and a top wall 340). One of the sidewalls 338 extends beyond the other adjoining sidewalls 338. The top wall 340) has opening 308 defining a fluid inlet end. A plenum chamber (not shown) is formed in interior compartment 341 between the opening, or fluid inlet end, 308, in the top wall 340 and the sidewall 338 that extends beyond the other sidewalls 338. The plenum chamber formed in enclosure 302 of the invention provides critical direction for fluid traveling from outside opening or fluid inlet end, 308 in the top wall 340 of the enclosure 302 into and through plenum chamber and then into the fluid inlet face 318 of the heat sink 312. Skilled artisans will, of course, appreciate that opening 308 may have any size configuration and vary in size. Preferably, however, best results are achieved when opening 308 is circular and has a diameter equal to or slightly greater than the inlet diameter of the fan impeller 306 disposed therein. Thus, the integrated design of the enclosure or housing 302 enclosing heat exchanger assemblage 300 results in a more efficient means of directing fluid or air in the most beneficial manner to the write head element 200 of the image processing equipment 100 of the invention.

The invention has therefore been described with reference to certain embodiments thereof, but it will be understood that variations and modifications can be effected within the scope of the invention.

What is claimed is:

1. Image processing equipment of the type comprising:

a write head element for forming images on a media;

means for thermally energizing said write head element; and, means for actuating said write head element for movement about said media; wherein the improvement comprises:

means thermally conductively associated with said write head element for absorbing and then dissipating heat buildup from said write head element, said means for absorbing and dissipating comprising:

a heat sink having a closed base, a plurality of substantially parallel closely spaced fins supported by said base, said closely spaced fins forming a plurality of narrow fluid passageways having an average space width in the range between about 0.008 inches to about 0.060 inches, said plurality of fluid passageways having a fluid inlet face and a fluid outlet face opposite said fluid inlet face;

an air moving means structurally connected to said heat sink, said air moving means comprising at least a partial enclosure configured to direct fluid from outside said at least partial enclosure into and through said at least partial enclosure; an impeller having a permanent magnet mounted thereto arranged for rotational movement in said at least partial enclosure, said impeller having a plurality of backward curved blades exposed to an opening in said at least partial enclosure for convectively moving fluid into said at least partial enclosure and through said plurality of fluid passageways of said heat sink, said impeller being capable of producing a fluid velocity and static pressure to force said fluid outside said at least partial enclosure through the closely spaced fins of said heat sink; and, drive means operably connected to said impeller and capable of producing rotational movement of said impeller, said drive means comprising a circuit board having a plurality of metallic coils arranged in magnetic proximity to said permanent magnet mounted to said impeller, said magnetic coils being configured to receive a current and thereby produce rotational movement of said impeller in response to said current, and wherein said drive means is further configured to produce an impeller speed in the range of 9000 to about 15000 RPMs.

2. The equipment recited in claim 1, wherein said write head element and said means for absorbing and then dissipating heat are thermally conductively connected using low thermal resistance screws and washers.

3. The equipment recited in claim 1, wherein said drive means comprises a small compact dc motor.

4. The equipment recited in claim 3, wherein said dc motor is configured to produce a static pressure up to about 8 inches of water.

5. The equipment recited in claim 1, wherein said plurality of fins have a heat transfer coefficient (h) up to about 99 Btu/hr-ft$^2$deg F.

* * * * *